United States Patent [19]

Dumbri et al.

[11] Patent Number: 4,567,581
[45] Date of Patent: Jan. 28, 1986

[54] COLUMN DECODER CIRCUIT FOR USE WITH MEMORY USING MULTIPLEXED ROW AND COLUMN ADDRESS LINES

[75] Inventors: Austin C. Dumbri, Easton; Frank J. Procyk, Center Valley, both of Pa.

[73] Assignee: AT&T Bell Laboratories, Murray Hill, N.J.

[21] Appl. No.: 452,156

[22] Filed: Dec. 22, 1982

[51] Int. Cl.³ .............................................. G11C 11/40
[52] U.S. Cl. .................................... 365/230; 365/203
[58] Field of Search ...................... 365/189, 230, 203

[56] References Cited

U.S. PATENT DOCUMENTS

| | | | |
|---|---|---|---|
| 4,074,237 | 2/1978 | Spampinato | 365/230 |
| 4,200,917 | 4/1980 | Moench | 365/208 |
| 4,475,181 | 10/1984 | Etoh et al. | 365/230 |

Primary Examiner—Joseph A. Popek
Attorney, Agent, or Firm—James H. Fox

[57] ABSTRACT

A memory having multiplexed address inputs uses a column decoder which is deactivated during row address time and becomes activated during column address time. Access time and power dissipation are reduced since the column decoder need not be fully recovered after row address information has terminated and column address information is available.

17 Claims, 4 Drawing Figures

ROW DECODER 18

MULTIPLEXER 20

COLUMN DECODER 16

COLUMN DECODER CIRCUIT FOR USE WITH MEMORY USING MULTIPLEXED ROW AND COLUMN ADDRESS LINES

FIELD OF THE INVENTION

This invention relates to memories, and in particular, to random access memories which use multiplexed input address lines and row and column decoder circuits.

BACKGROUND OF THE INVENTION

Many of today's large capacity semiconductor random access memories use multiplexed input address lines in order to limit the number of external pins on the package and to make same compatible with available memories which have smaller capacity. These large capacity memories typically use several sub-arrays which have row and column decoders that must be coupled to the output address lines of an input address buffer. During a typical cycle of operation, row address information is first applied to the input address lines and then after the rows (word lines) of the memory are appropriately selected or deselected, column address information is applied to the input address lines. In some memories, the column decoders receive the row address information and are simultaneously selected or deselected with the row decoders. The column decoders must then be recovered before column address information is applied to the input address lines. This adversely affects access time and increases power dissipation.

It would be desirable in a multiplexed input address memory to have column decoders which are effectively deactivated during the time row address information is being received by the memory and which are fully activated by the subsequent time at which column address information is applied to the memory.

SUMMARY OF THE INVENTION

The present invention is directed to decoder circuitry which is particularly useful with a memory which uses multiplexed input address lines. The decoder circuitry comprises a plurality of decoder switching devices, each has a control terminal that serves as an input circuitry terminal, and first and second output terminals. The first output terminals are all coupled together to "a" terminal and to a first circuit means for selectively setting the potential of the "a" terminal to a first preselected level. The second output terminals are all coupled together to a "b" terminal and to a second circuit means for selectively setting the "b" terminal to the first level. A third circuit means is coupled to the "b" terminal for selectively setting the potential thereof to a second preselected level which is different than the first level.

In one embodiment, the switching devices are all n-channel field effect transistors. During the operation of a multiplexed input address memory, the "a" and "b" terminals are both set to the first potential level when row address information is at the input terminals of the column decoder. This causes both output terminals of the decoder transistors to be at the same potential level and thus independent of whether the received input address signals are high or low. The decoder remains inactive since none of the decoder transistors conduct. When subsequent column address information is applied to the input terminals of the column decoder, then the potential of terminal "b" is set to the second level. This activates the decoder in that one or more of the decoder transistors can be enabled and can discharge the "a" terminal from the first potential level to the second potential level. The decoder is said to be nonselected in such cases. If the column address information does not enable any of the column decoder transistors, the decoder is said to be selected, and the "a" terminal stays at or near the first potential level.

The use of the second circuit means to selectively set the potential of terminal "b" to the first potential level while terminal "a" is also set to the first potential level results in no current flowing between any of the drains and sources of the decoder transistors independent of the information on the input terminals. This leaves terminal "a" at or near the first potential level after the row address information terminates. Prior to the application of column address information, the second circuit means sets the potential of the terminal "b" to the second level. The potential of terminal "a" electrically floats at or near the previously set first level. The decoder transistors can now be enabled by input column address information, and current can flow from terminal "a" to terminal "b" so as to discharge (change) the potential of terminal "a" to that of terminal "b" which is held at the second level.

A conventional decoder would have to have the corresponding terminal "a" reset in potential to the first level after the row address information terminates. This causes a loss in time and increases power dissipation. The present decoder circuitry saves this lost time and power dissipation.

These and other features and advantages of the invention are better understood from a consideration of the following description taken in conjunction with the accompanying drawings.

DETAILED DESCRIPTION

Figure 1:
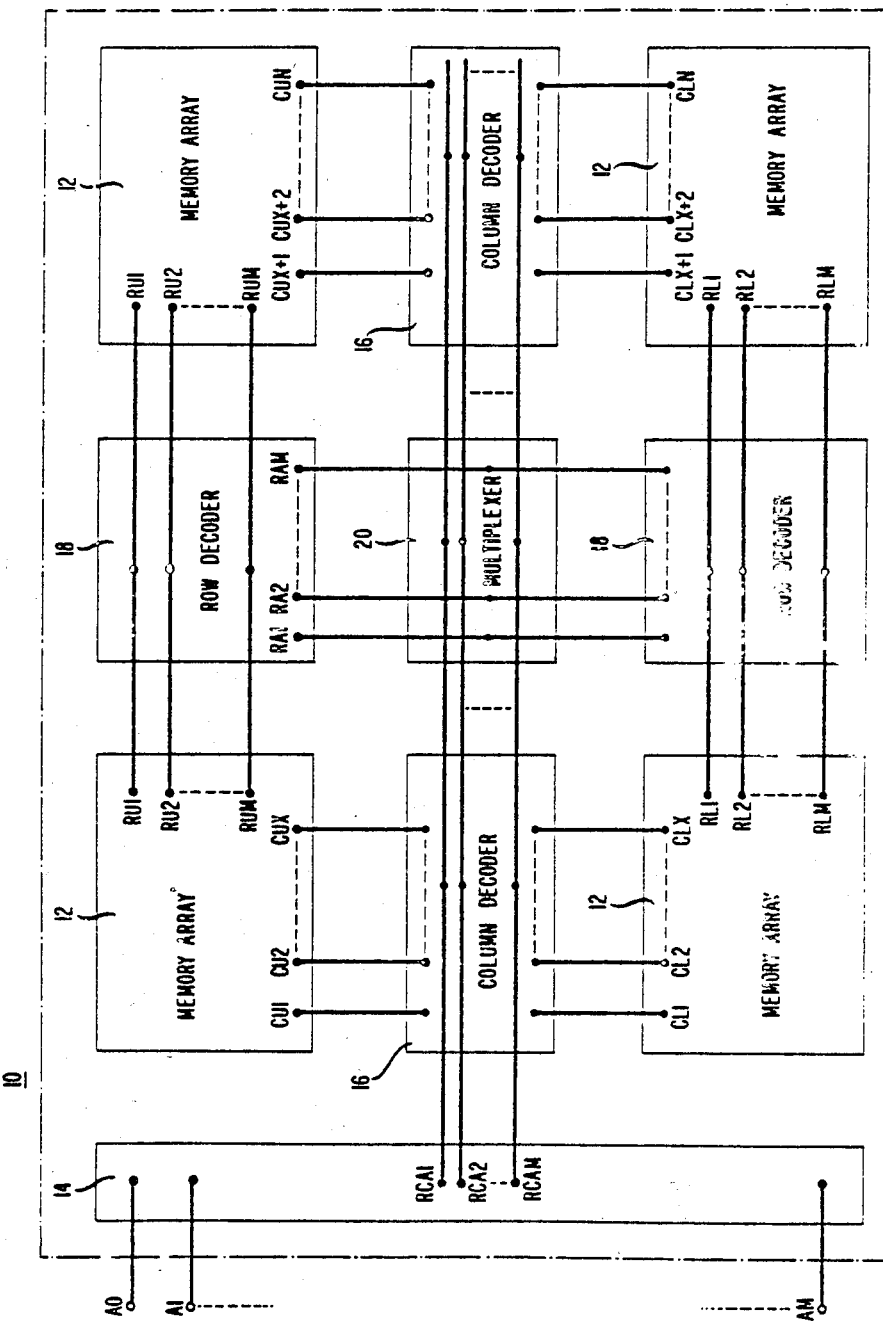
FIG. 1 illustrates in simplified block schematic form portions of a memory which includes a column decoder in accordance with the invention.

Referring now to FIG. 1, there is illustrated a portion of a memory 10 having four quadrants of memory arrays 12, an address buffer 14, a two-portion column decoder 16, a two-portion row decoder 18, and a multiplexer 20. Memory 10 is described in a patent application having a common assignee and which is being filed concurrently with the present application, and having the designated Ser. No. 452,155, filed Dec. 22, 1982. The present application is directed particularly to the column decoder 16 (illustrated in FIG. 1 and 3) of the memory.

Externally supplied row and column address signals are sequentially applied to input terminals A0, A1 . . . AM of address buffer 14. The output lines of address buffer 14, row-column address lines (conductors) RCA1, RCA2 . . . RCAM, which also include the complementary row-column address lines RCA1C, RCA2C . . . RCAMC (not illustrated), are coupled to both portions of column decoder 16 and to multiplexer 20. Row address lines RA1, RA2 ... RAM, which also include the complementary row address lines RA1C, RA2C ... RAMC (not illustrated), couple multiplexer 20 to both portions of row decoder 18. The portions of RCA1, RCA2 ... RCAM between address buffer 14 and multiplexer 20 serve the dual purpose of supplying row address and column address information to the row and column decoders, respectively. The use of just one set of such lines helps reduce the oversize of the memory chip and thereby increases yield and reduces cost.

The left portion of column decoder 16 (the portion left of multiplexer 20) is coupled through lines CU1, CU2 ... CUX to columns of the upper-left memory array 12 and is coupled through lines CL1, CL2 ... CLX to columns of the lower-left memory array 12. The right portion of column decoder 16 (the portion right of multiplexer 20) is coupled through lines CUX+1, CUX+2 ... CUN to columns of the upper-right memory array 12 and is coupled through lines CLX+1, CL+2 ... CLN to columns of the lower-right memory array 12. The upper portion of row decoder 18 is coupled through lines RU1, RU2 ... RUM to rows of both upper memory arrays 12. The lower portion of row decoder 18 is coupled through lines RL1, RL2 ... RLM to rows of both lower memory arrays 12. Address buffer 14 output lines RCA1, RCA2 ... RCAM are coupled to both portions of column decoder 16 and to multiplexer 20. Lines RA1, RA2 ... RAM couple both portions of row decoder 18 to multiplexer 20. The upper two portions of the memory array form one sub-memory array, and the two lower portions of the memory array form a second sub-memory array.

The operation of the memory is such that row address information is first applied to input terminals A0, A1 ... AM, and the output signals of address buffer 14 appear on RCA1, RCA2 ... RCAM. At this time, column decoder circuits 16 are all disabled, and multiplexer 20 is activated such that the row address signals on RCA1, RCA2 ... RCAM are transferred through multiplexer 20 to row address lines RA1, RA2 ... RAM, respectively. After all row decoders decode the received row address signals, and selection of the appropriate row of a memory array is made, the multiplexer 20 decouples RA1, RA2 ... RAM from RCA1, RCA2 ... RCAM, row address information applied to input terminals A0, A1 ... AM is terminated, and column address information is applied to input terminals A0, A1 ... AM. Subsequently, the column decoders are activated, and the column information is supplied to the memory arrays in an analogous fashion.

Figure 2:
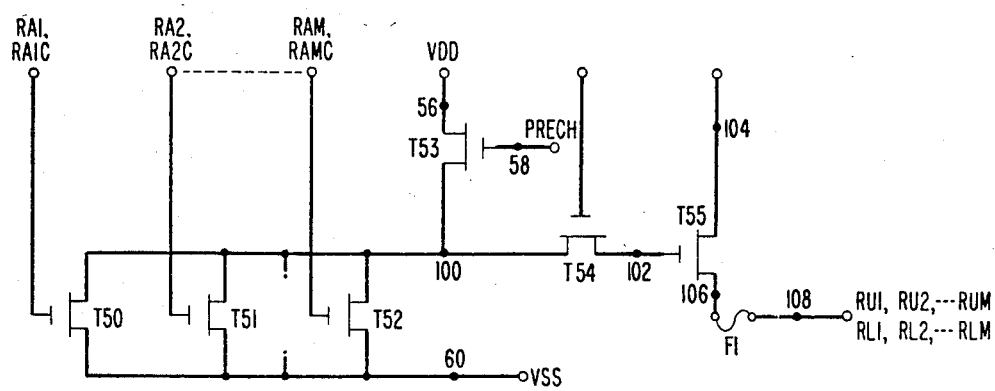
FIG. 2 illustrates in circuit schematic form a row decoder which can be used with the memory of FIG. 1.

As is well known, each of the row decoder portions and the column decoder portions typically comprise a plurality of row decoder circuits and column decoder circuits, respectively, one for each row or column of the memory being served. In FIG. 2, there is illustrated a suitable individual row decoder circuit and in FIG. 3 a suitable individual column decoder circuit and in FIG. 4 there is illustrated a suitable multiplexer circuit, which are exemplary of the circuits that can be used.

Turning now to FIG. 2, the individual row decoder 18 is of a kind well known in the art and basically comprises a parallel group of MOS address decoding transistors T50, T51, and T52 (one for each binary digit of the address to be decoded), a precharge transistor T53, an interrupt (buffer) transistor T54, a driver transistor T55, and a fusible link F1 which is optional but useful for eliminating this decoder if redundancy is being provided in the memory. For simplicity, only three of the address decoding transistors T50, T51, and T52 are shown. Each of the drains of T50, T51, T52, and T54, and the source of T53, are coupled to a common node 100. The drain of T53 is coupled to a node 56 and maintained at the potential of the voltage level VDD. The source of T54 is coupled to the gate of T55 and to a node 102. The sources of T50, T51, and T52 are all coupled to a node 60 and maintained at the potential of the voltage level VSS which is typically, but not necessarily, ground potential. Interrupt transistor T54 serves as a transmission gate permitting selective isolation of the high capacitance on node 100 from the gate of driver transistor T55. The on-off state of transistor 54 is controlled by an appropriate fixed potential level or by a control pulse applied to its gate. As is well known to workers in the art, a particular decoder of the kind shown is selected when all of the inputs to the decoding transistors T50, T51, and T52, supplied from addressing circuits (not illustrated), are low, in which case node 100 is maintained high, and the associated driver transistor T55, whose gate is controlled by the voltage on node 102 is kept on, permitting a high drive voltage provided on the drain (terminal 104) of transistor T55 to be applied to the source of T55 (node 106) and through F1 to nodes RU1, RU2 ... RUM, RL1, RL2 ... RLM of the standard memory arrays. If the particular decoder is to be deselected (not selected), one or more of the inputs applied to it from the addressing circuits will be high, in which case the voltage on node 100 drops to approximately VSS, and transistor T55 turns off whereby no drive voltage reaches node 106. As previously mentioned, if redundancy is desired, a fusible link F1 is typically included in each of the standard decoders, and this link is left undistrubed if the particular decoder is to be retained in the standard array, as is the case if prior testing has determined that the cells to be accessed by way of its associated conductor are all defect-free. However, if the prior testing has established that any cell to be accessed by it is defective and so not fit for use in the memory, the link in the decoder is opened, advantageously by laser vaporation. A spare row decoder (not illustrated) is substituted for the defective row decoder by techniques well known in the art.

In a preferred embodiment, the link opened is a layer of silicide on a layer of polysilicon doped to be highly conductive, about 5000 Angstroms thick, about 10 microns long, and about 2 microns wide, and it is opened by being vaporized by incident high energy pulses provided by a 1.06 or 0.53 micron YAG laser. Advantageously, this is done after the memory chip fabrication is essentially complete by which time the combined polysilicon-silicide layer will have been covered with a phosphorus doped glass which, however, is transparent to the radiation.

Figure 3:
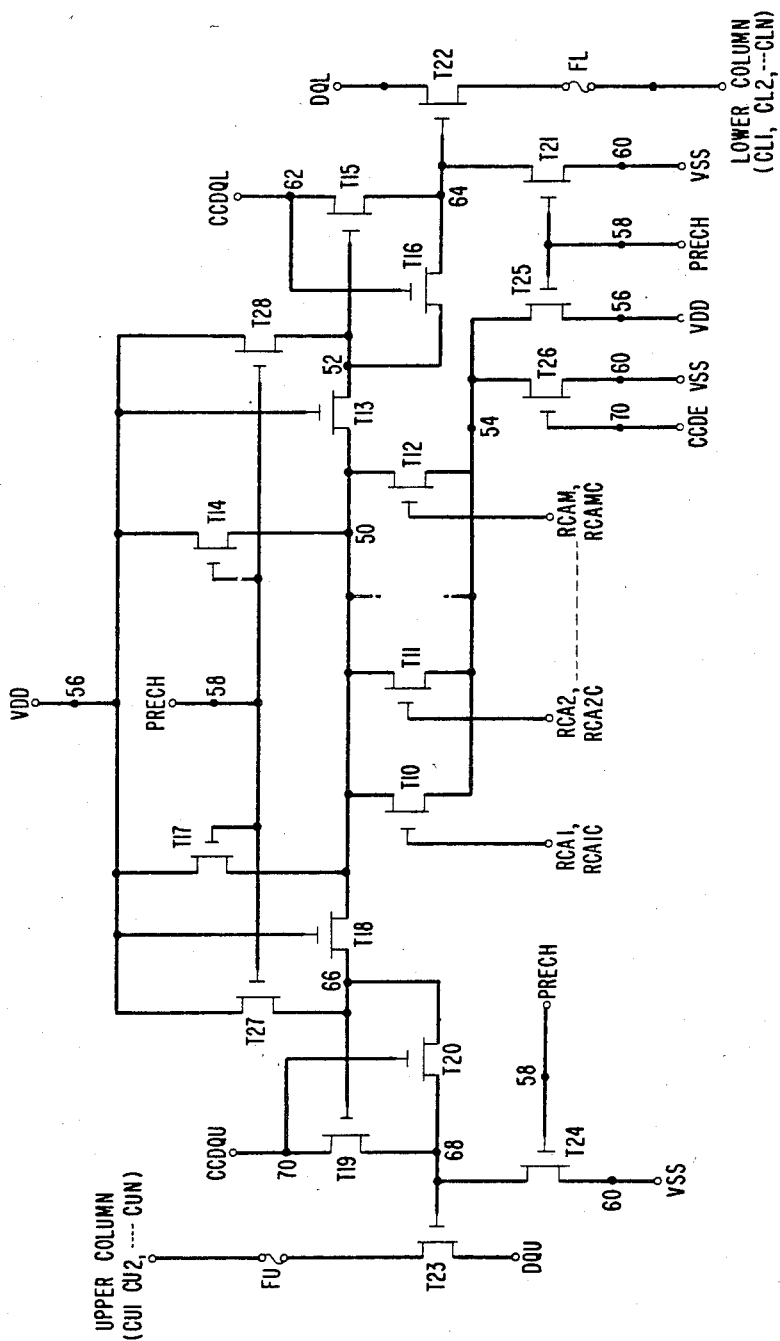
FIG. 3 illustrates in circuit schematic form a column decoder which can be used with the memory of FIG. 1, and which is in accordance with the invention.

Turning now to FIG. 3, the individual column decoder 16 includes a basic section. This basic section comprises a parallel group of MOS address decoding transistors, of which only three are shown, T10, T11, and T12, precharge transistors T14, T17, T21, T24, T27, and T28, interrupt transistors T13 and T18, driver transistors T15 and T19, output column transistors T22 and T23, quieting transistors T16 and T20, and fusible links FU and FL which are optional. Transistors T25 and T26 are modifications to the basic section in accordance with the present invention and function to activate or deactivate column decoder 16, as will be explained below.

Each of the drains of T10, T11, T12, T13, and T18 and the sources of T14 and T17, are coupled to a common node 50. The drains of T14, T17, T25, T27, and T28, and the gates of T13 and T18, are coupled to a node 56 which is maintained at the potential of the voltage level VDD. The source of T13 is coupled to the gate of T15, to the source of T28, to the source of T16, and to a node 52. The source of T18 is coupled to the sources of T20 and T27, and to the gate of T19, and to a node 66. The sources of T10, T11, and T12 are all coupled to a node 54 and to the source of T25 and to the drain of T26. The sources of T21, T24, and T26 are coupled to a node 60 and maintained at the voltage level VSS, which is typically, but not necessarily, ground potential. The gates of T13 and T18 are illustrated coupled to VDD, but same could be coupled to a voltage pulse source (not illustrated) which would selectively turn on and off the transistors. The gate of T16 is coupled to the drain of T15, to a node 62, and to a source of voltage pulse CCDQL. The source of T15 is coupled to the drain of T21, the gate of T22, the drain of T16, and to a node 64. The drain of T22 is coupled to a node DQL, and the source of T22 is coupled through FL to one of lower column lines CL1, CL2 . . . CLX, CLX+1, CLX+2 . . . CLN. The source of T20 is coupled to the source of T27, the gate of T19, the source of T18, and to a node 66. The gate of T20 is coupled to the drain of T19, to a node 70, and to a source of voltage pulses CCDQU. The source of T19 is coupled to the gate of T23, to the drain of T24, to the drain of T20, and to a node 68. The source of T23 is coupled through FU to one of upper column lines CU1, CU2 . . . CUX, CUX+1, CUX+2 . . . CUN, and the drain of T23 is coupled to a node DQU. The gates of T14, T17, T21, T24, T25, T27, and T28 are coupled to a node 58 and to a source of voltage pulses PRECH. The gate of T26 is coupled to node 70 and to a voltage pulse source CCDE. Interrupt transistors T13 and T18 serve as transmission gates permitting selective isolation of the high capacitance on node 50 from nodes 52 and 66.

Column decoder 16 is essentially activated by having CCDE high and PRECH low. This causes terminal 54 to be low, at or near VSS in potential. With CCDE high and PRECH low, column decoder 16 is selected when all of the input signals RCA0, RCA0C, RCA1, RCA1C, RCAM, RCAMC to the decoding transistors T10, T11, and T12, supplied from address buffer 14, are low. With these conditions, node 50 is maintained high, and the associated driver transistors T15 and T19, whose gates are controlled by the voltage on nodes 52 and 66, respectively, are kept on, permitting a high drive voltage provided by pulse source CCDQL at node 62 (the drain of transistor T15) or by pulse source CCDQU at node 70 (the drain of T19) to be applied to output node 64 or 68 and thereby turn on T22 or T23. During the time column address information is being received by column decoder 16, CCDQU or CCDQL is high and the other is low. If a selected memory cell is in the upper section of the memory array, then CCDQU is high and CCDQL is low. Conversely, if a selected memory cell is in the lower section of the memory array, then CCDQL is high and CCDQU is low. If the particular decoder is to be deselected (not selected) by the input column address information, one or more of the inputs applied to it from the addressing circuits is high. In such case the voltage on node 50 drops to approximately VSS, and transistors T15 and T19 turn off whereby no drive voltage reaches nodes 64 and 68. As previously mentioned, fusible links FU and FL are typically included and are left undisturbed if the particular decoder and its associated cells are to be retained in the standard array, as is the case if prior testing has determined that the cells to be accessed by way of its associated conductor are all defect-free. However, if the prior testing has established that any cell to be accessed by it is defective and so not fit for use in the memory, the link in the decoder is opened, advantageously by laser vaporation. In such case, a spare column decoder (not illustrated) is substituted by techniques well known in the art.

As is discussed above, column decoder 16, in order to be deselected by column address information, must be activated by having T26 biased on and T25 biased off. At the beginning of a cycle of operation of memory 10, the precharge signal PRECH applied to terminal 58 is high, and the CCDE signal applied to the gate of T26 is low. This inhibits address information appearing on the gates of T10, T11, and T12 to affect nodes 50 and 54 by causing nodes 50 and 54 to be at a potential at or close to VDD. This would correspond to a selected decoder but for the fact that during the time PRECH is high (the time during which row address information appears on row-column address lines RCA1, RCA2 . . . RCAM), CCDQU and CCDQL are both held low. This keeps T22 and T23 biased off. This leaves terminal 50 at or near VDD in potential. As soon as the column decoder 16 is activated by CCDE going high and PRECH going low, column address information can be applied to column decoder 16, and there is no need to waste time or energy first charging node 50 to a potential level at or near VDD since it is already at said potential. It is necessary to discharge node 54 from at or near VDD to VSS before column decoder 16 is fully activated. The time necessary to so discharge node 54 is small compared to the time it would take to charge node 50 to VDD if same were not left at VDD by T25.

T16 and T20 serve to help maintain nodes 64 and 68, respectively, at or close to VSS when nodes 52 and 66, respectively, are nominally at VSS. During read or write operations of the memory, signals (not illustrated) on the column lines may cause capacitive coupling to terminals 64 and 68, which can cause the potential thereof to vary from desired levels. T16 and T20 serve to maintain the desired levels on these nodes.

Figure 4:
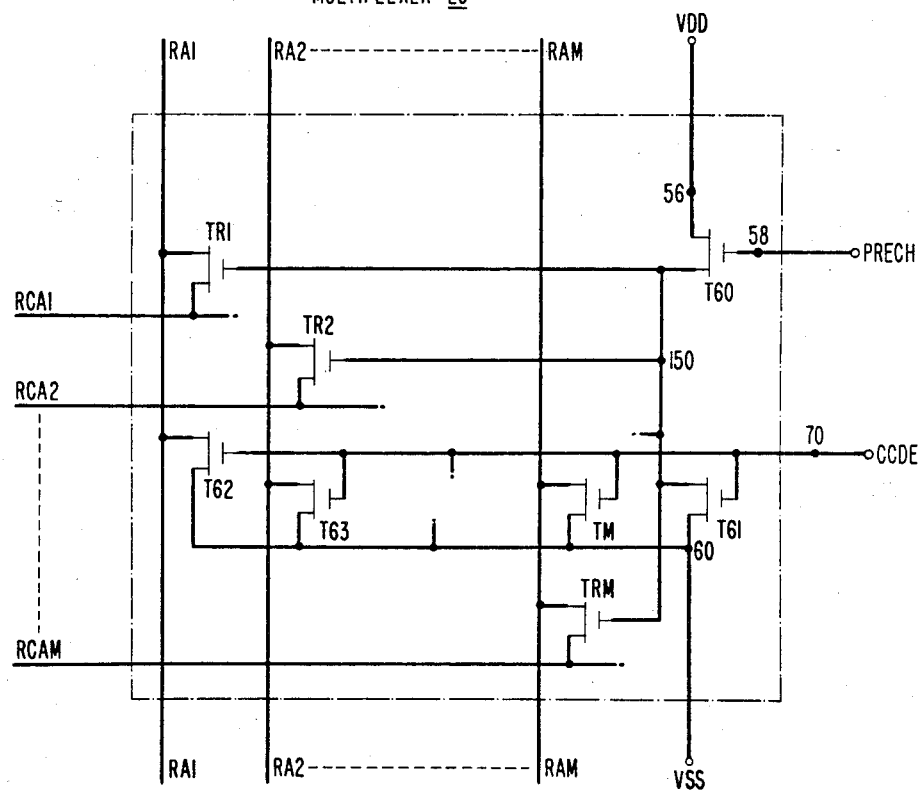
FIG. 4 illustrates in circuit schematic form a multiplexer which can be used with the memory of FIG. 1.

Now turning to FIG. 4, multiplexer 20 comprises essentially row-column address coupling-decoupling transistors TR1, TR2 . . . TRM, with each of said transistors having the drain coupled to one of the row-column address lines RCA1, RCA2 . . . RCAM and the source coupled to one of the row address lines RA1, RA2 . . . RAM. The gates of all of TR1, TR2 . . . TRM are all coupled to the drain of a transistor T60, to the drain of a transistor T61, and to a node 150. The drain of T60 is coupled to node 56 and maintained at the potential voltage level VDD. The source of T61 is coupled to a node 60 and maintained at the potential voltage level VSS. A separate transistor T62, T63 . . . TM is coupled by the drain to each one of RA1, RA2 . . . RAM and by the source to node 60 and to VSS. The gates of T61, T62, T63 . . . TM are all coupled together to a node 70 and to a voltage pulse source CCDE. The gate of T60 is coupled to a node 58 and to a voltage pulse source PRECH.

At the beginning of a cycle of memory 10, CCDE is low and PRECH is high. This turns on T60 and turns off T61, T62, T63 . . . TM. Consequently, node 150 is high, and TR1, TR2 . . . TRM are turned on. Address input information applied to input terminals A0, A1 . . . AM results in row addresses on RCA1, RCA2 . . . RCAM. The row addresses couple through TR1, TR2 . . . TRM, respectively, and reach the gates of the row address decoder transistors of row decoder 18. After the row address information has been decoded by the row address decoder 18, PRECH goes low and CCDE goes high. This turns on T61 and T62, T63 . . . TM. Node 150 assumes a low potential, and consequently TR1, TR2 . . . TRM are all biased off. In addition, each of RA1, RA2 . . . RAM is low in potential. These conditions essentially decouple row decoder 18 from lines RCA1, RCA2 . . . RCAM. Column address information is now applied to input terminals A0, A1 . . . AM, and column address information now reaches the column decoder 16 which becomes activated at this time.

A 256K DRAM has been fabricated on a single silicon chip and tested and found to be functional. It uses multiplexed row-column address lines, a multiplexer, and row and column decoders as are illustrated and described herein. The upper and lower memory arrays each contain 128K of memory.

The embodiments described herein are intended to be illustrative of the general principles of the present invention. Various modifications are possible consistent with the spirit of the invention. For example, column decoders may be common to multiple pairs of columns. Still further, the row and column decoders need not have fusible links and accordingly need not be replaceable if same fails. Still further, bipolar or complementary MOS transistors or other types of switches could be used in the column decoder.

What is claimed is:

1. Circuitry comprising:
    a plurality of decoder switching devices which each have control terminals that serve as input terminals of the circuitry, and first and second output terminals, all of the first output terminals being coupled together to an "a" terminal and all of the second output terminals being coupled together to a "b" terminal;
    first circuit means coupled to the "a" terminal for selectively setting the potential thereof to a first preselected level;
    second circuit means coupled to the "b" terminal for selectively setting the potential thereof to the first preselected level;
    third circuit means coupled to the "b" terminal for selectively setting the potential thereof to a second preselected level which is a different level than the first level;
    a first driver switching device having a control terminal coupled to the "a" terminal and having first and second output terminals;
    a first buffer switching device having a first output terminal coupled to the "a" terminal and having a second output terminal coupled to the control terminal of the driver switching device which is coupled to the "a" terminal through the buffer switching device;
    fourth circuit means coupled to the control terminal of the first driver switching device for selectively setting the potential thereof to the first level; and
    fifth circuit means coupled to the control terminal of the first driver switching device for selectively setting the potential thereof to the second level.

2. The circuitry of claim 1 further comprising a second driver switching device having a control terminal coupled to the second output terminal of the first driver device and having first and second output terminals.

3. The circuitry of claim 2 further comprising a quieting switching device having a control terminal coupled to the first output terminal of the first driver switching device, having a first output terminal coupled to the second output terminal of the buffer switching device, and having a second output terminal coupled to the second output terminal of the first driver switching device.

4. The circuitry of claim 3 wherein:
    the first circut means comprises a first charging/discharging switching device having a control terminal, a first output terminal, and a second output terminal coupled to the "a" terminal;
    the second circuit means comprises a second charging/discharging switching device having a control terminal, a first output terminal coupled to the "b" terminal, and a second output terminal; and
    the third circuit means comprises a third charging-/discharging switching device having a control terminal, a first output terminal coupled to the "b" terminal, and a second output terminal.

5. The circuitry of claim 4 wherein:
    the fourth circuit means comprises a fourth charging-/discharging switching device having a control terminal, a first output terminal, and a second output terminal coupled to the control terminal of the first driver switching device; and
    the fifth circuit means comprises a fifth charging/discharging switching device having a control terminal, a first output terminal coupled to the second output terminal of the first driver switching device, and a second output terminal.

6. The circuitry of claim 5 wherein:
    the control terminals of the first, second, fourth, and fifth charging/discharging switching devices being coupled together;
    the first output terminals of the first, second, and fourth charging/discharging switching devices being coupled together; and
    the second output terminals of the third and fifth charging/discharging switching devices being coupled together.

7. The circuitry of claim 6 wherein:
    the first output terminals of the first, second, and fourth charging/discharging switching devices being connectable to a potential source which has a level which is at or near the first level; and
    the second output terminals of the third and fifth charging/discharging switching devices being connectable to a potential source which has a level at or near the second level.

8. The circuitry of claim 7 wherein:
    the control terminals of the first, second, fourth, and fifth charging/discharging switching devices being connectable to a first voltage pulse source;
    the control terminal of the third charging/discharging switching device being connectable to a second voltage pulse source; and
    the first and second voltage pulse sources being adapted to selectively provide complementary output signals.

9. The circuitry of claim 8 further comprising:
    a second buffer switching device, third and fourth driver switching devices, and a second quieting switching device, each of these switching devices having a control terminal and first and second output terminals;

the first output terminal of the second buffer switching device being coupled to the "a" terminal and the second ouput terminal being coupled to the first output terminal of the second quieting switching device, and to the control terminal of the third driver switching device;

the control terminal of the second quieting switching device being coupled to the first output terminal of the third driver switching device;

the second output terminal of the second quieting switching device being coupled to the second output terminal of the third driver switching device and to the control terminal of the fourth driver switching device;

sixth circuit means coupled to the control terminal of the third driver switching device for selectively setting the potential thereof to the first level; and seventh circuit means coupled to the control terminal of the fourth driver switching device for selectively setting the potential thereof to the second level.

10. The circuitry of claim 9 wherein:

the sixth circuit means comprises a sixth charging-/discharging switching device having a control terminal, a first output terminal, and a second output terminal coupled to the control terminal of the third driver switching device;

the seventh circuit means comprises a seventh charging/discharging switching device having a control terminal, having a first output terminal coupled to the control terminal of the fourth driver switching device, and having a second output terminal;

the control terminal of the sixth charging/discharging switching device being connectable to the first voltage pulse source;

the first output terminal of the sixth charging/discharging device being connectable to a potential source which has a level at or near the first level; and the second output terminal of the seventh charging-/discharging device being connectable to a potential source which has a level at or near the second level.

11. The circuitry of claim 10 wherein all the switching devices are field effect transistors with the gates being the control terminals and the drains and sources being the output terminals.

12. The circuitry of claim 10 wherein all the transistors are n-channel type.

13. The circuitry of claim 10 wherein all the transistors are p-channel type.

14. The circuitry of claim 7 wherein all of the switching devices are field effect transistos with the gates being the control terminals and the drains and sources being the output terminals.

15. The circuitry of claim 14 wherein all the transistors are n-channel type.

16. The circuitry of claim 14 wherein all the transistors are p-channel type.

17. Address decoding circuitry which is for use in a memory which is supplied with both row and column address information of which only the column address information is intended to activate the circuit comprising a plurality of decoding transistors, the number of which being determined by the length of address, each comprising a control terminal to which the address information is applied and first and second output terminals comprising:

means for setting the first output terminal of each transistor at a first potential level prior to the application of all input address information to the control terminal of the transistor:

means for setting the potential of the second output terminal of each transistor to a second level which is different from the first level prior to or during or after the application of column input address information whereby each transistor is activated for decoding; and means for setting the potential of the second output terminal of each transistor to the first level prior to the application of row input address information.

* * * * *